United States Patent

[11] 3,599,323

[72] Inventor Arjun N. Saxena
Williamstown, Mass.
[21] Appl. No. 778,533
[22] Filed Nov. 25, 1968
[45] Patented Aug. 17, 1971
[73] Assignee Sprague Electric Company
North Adams, Mass.

[54] HOT CARRIER DIODE HAVING LOW TURN-ON VOLTAGE
2 Claims, 4 Drawing Figs.

[52] U.S. Cl. .................................................. 29/590, 317/234, 156/17
[51] Int. Cl. .................................................. B01j 17/00, H01l 7/24
[50] Field of Search .................................................. 29/576 E, 590, 589; 317/235; 148/175; 117/212, 213

[56] References Cited
UNITED STATES PATENTS

| | | | |
|---|---|---|---|
| 3,388,000 | 6/1968 | Waters et al. | 317/235 (31) UX |
| 3,458,778 | 7/1969 | Genzabella et al. | 317/235 (31) UX |
| 3,500,144 | 3/1970 | Walterau | 317/235 (31) UX |
| 3,309,760 | 3/1967 | Rezwick et al. | 117/213 X |

*Primary Examiner*—John F. Campbell
*Assistant Examiner*—W. Tupman
*Attorneys*—Connolly and Hutz, Vincent H. Sweeney, James Paul O'Sullivan and David R. Thornton

ABSTRACT: A hot carrier diode is provided by depositing vaporized chromium onto a prepared P-type silicon surface. Current flow is by the Schottky emission of hot holes from silicon over the relatively low barrier at the chromium-silicon interface resulting in a device with a characteristically low turn-on voltage.

HOT CARRIER DIODE HAVING LOW TURN-ON VOLTAGE

BACKGROUND OF THE INVENTION

The invention relates to hot carrier (planar Schottky barrier) diodes and, in particular, to such a diode formed by depositing a chromium film on the specially prepared surface of P-type silicon wafer.

Present commercial hot carrier diodes are formed by depositing metal films such as gold, nickel and chromium on N-type silicon. In this device, the hot carriers are hot electrons: hence they are referred to as hot electron diodes. Because of their planar construction, these diodes have a high degree of uniformity; they obey Schottky theory almost perfectly and hence have ideal theoretical performance. In addition, they are very reliable and rugged, and have a high burnout capability. Because of these qualities, they have been considered for, and to some extent, used in such applications as microwave and video detection and signal mixing. The dominant diode used in these applications at present is the point contact diode whose characteristics are inferior to those of the hot electron diode cited above save in one respect: it has a lower turn-on voltage (0.27 v. for the point contact v.s. 0.35 v. for the hot electron). In many of these applications low input power requirements are economically necessary enabling the point contact diode to maintain a dominant position vis-a-vis the hot electron diode.

It is therefore one object of this invention to provide a diode having the uniformity and reliability of the hot electron diode but with a lower turn-on voltage.

It is a further object to provide a diode which will replace a point contact diode in detection and mixing circuits in which the latter is presently used.

SUMMARY OF THE INVENTION

Broadly, this invention comprises a hot carrier diode formed by depositing a metal film on the prepared surface of a semiconductor, More particularly, a chromium-silicon Schottky barrier is formed on a specially cleaned P-type silicon wafer resulting in a hot carrier diode wherein the carriers are "hot" holes. The barrier height for this device is lower than that for a hot electron device formed on an N-type wafer resulting in a device with a relatively lower turn-on voltage. The hot hole diode has all the advantages of the hot electron diode, vis-a-vis, the point contact diode (more reliable, rugged, etc.) and, with a turn-on voltage approximately equal to the latter, achieves a definite superiority.

The hot hole diode is also superior to the p-n junction diode both in uniformity and in having a lower turn-on voltage. Thus, it could also supplant the junction diode in many of its applications.

DESCRIPTION OF THE INVENTION

Figure 1:
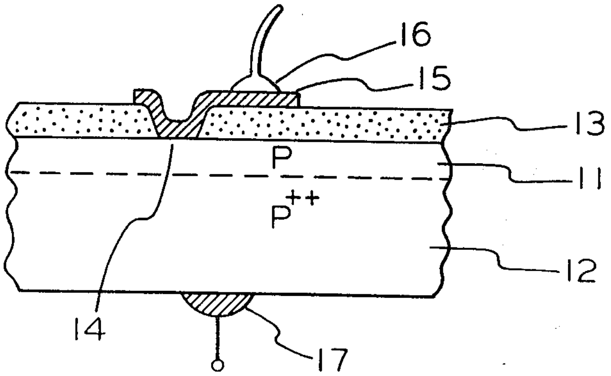
FIG. 1 shows a cross section view of a diode formed in accordance with the invention.

FIG. 1 shows a Schottky barrier diode fabricated in accordance with this invention. Epitaxial P-type silicon layer 11 is grown on heavily doped $P^{++}$silicon wafer 12. Layer 11 has a resistivity in the range of 0.2 to 0.4 Ωcm. and a thickness of 2—3 μ while wafer 12 has a resistivity of <0.008 Ωcm. with boron as the dopant. The wafer is oxidized to grow a passivating layer 13 of silicon dioxide of approximately 5,000 A. thickness. Standard photolithographic techniques are used to etch circular area 14 of approximately 0.8-mil diameter through layer 13.

Figure 2A:
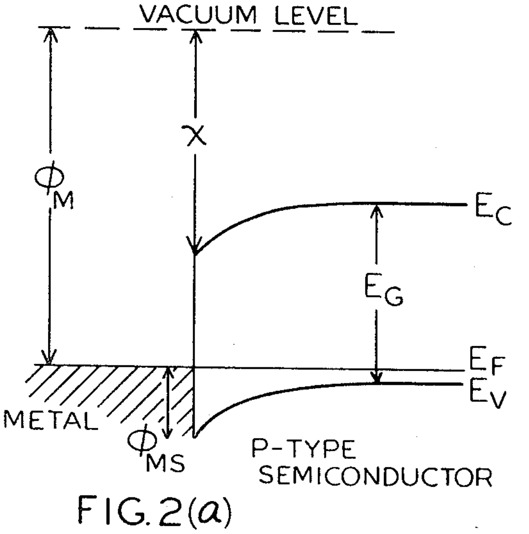
FIG. 2 (*a*) and 2 (*b*) show the relative barrier heights of a hot carrier (electron) diode and the present invention.
Figure 2B:
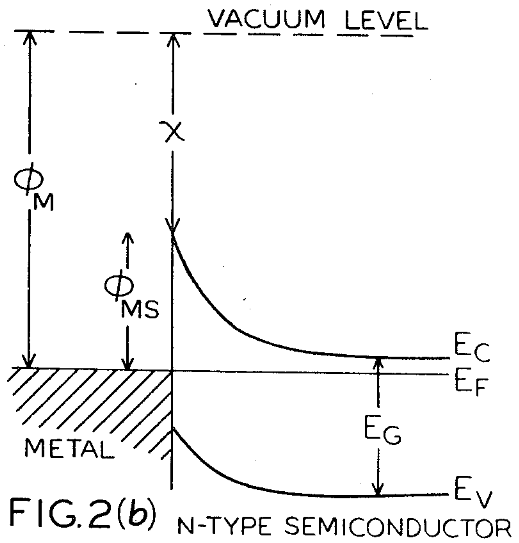

In order to produce a chromium-silicon interface comparable in uniformity to a diffused P-N junction, a "clean" silicon surface must be prepared. A feature of this invention is the cleaning of the wafer surface prior to the ensuing evaporation step. The surface is first cleaned with trichlorethylene, acetone and deionized water and blown dry with $N_2$. The surface is then etched in 10: 1 hydrofluoric acid for 30 seconds at room temperature, rinsed thoroughly with deionized water, and blown dry with $N_2$. The wafer is placed in the vacuum evaporation system and a layer of chromium approximately 1,000 A. thick is evaporated over the entire wafer surface. Again, using standard photolithographic techniques, the unwanted metal is etched away leaving film 15 which forms the Schottky barrier. External electrical connection is made to the metal by means of thermocompression bonded or soldered metal lead 16. The second terminal of the diode compresses ohmic contact 17 applied to the opposite surface of substrate 12. The technique for making such plated ohmic contacts is well known in the art. The current flow in the forward direction is by the Schottky emission of hot holes from silicon over the barrier at the metal-semiconductor interface. The barrier height of the device is governed approximately by the difference in the work function of the metal and that of the semiconductor. FIGS. 2(*a*) and 2(*b*) show, respectively the relative barrier heights of the present invention formed in the P-type semiconductor compared to a hot electron diode formed in an N-type semiconductor.

Figure 3:
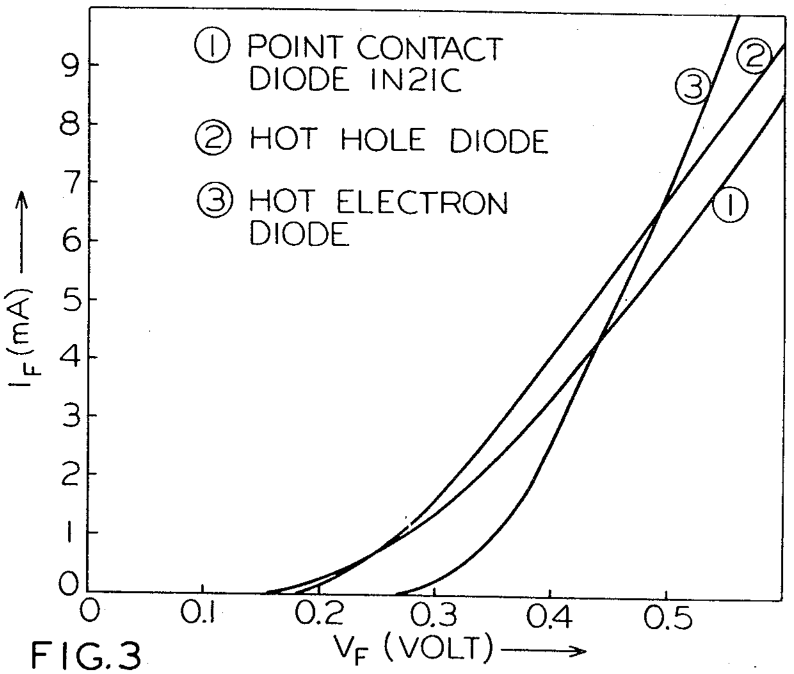
FIG. 3 is a plot of the I-V characteristics of the invention vs. the characteristics of a commercial hot electron and point contact diode.

In the figures, $\Phi_{MS}$ is the barrier height for the particular type semiconductor; $\Phi_M$ is the work function of the metal; $x$ is the electron affinity defined as the energy required to remove an electron from the bottom of the conductor band to the vacuum level; $E_G$ is the energy gap of the semiconductor; $E_C$ is the bottom of the conduction band, $E_F$ is the Fermi level and $E_V$ is the top of the valence band. Referring to FIG. 2 (*a*), the barrier height $\Phi_{MS}$ of the present invention is approximately one-third $E_G$ while the FIG. 2(*b*), $\Phi_{MS}$ for the N-type semiconductor is about two-thirds $E_G$. The lower barrier height of the present device results in a turn-on voltage lower than the hot electron diode and which approaches commercial point contact diodes. FIG. 3 shows the forward and reverse I-V plots of point contact diode 1N21C; a low-breakdown voltage hot electron diode and the hot hole diode formed according to this invention. It is clear that both the hot carrier devices have higher forward conductances than the point contact diode. But it is the present device which most closely matches the characteristics of the point contact diode including a low turn-on voltage of approximately 0.27 volt (compared to 0.35 v. for the hot electron diode).

The resistivity and thickness of the silicon substrate 12 and epitaxial layer 11 depends upon the use to which the device is to be put. For example, if high-breakdown voltages are required, the resistivity and thickness must accordingly be increased. Similarly, for low-breakdown applications, smaller resistivities and thinner layers can be used.

SInce it is obvious that many changes and modifications can be made in the above-described details without departing from the nature and spirit of the invention, it is to be understood that the the resistivity is not limited to said details except as set forth in the appended claims.

What I claim is:

1. A method for forming hot hole diodes comprising the steps of: (a) forming an epitaxial lightly doped P-type silicon layer on a heavily doped P-type silicon wafer, (b) oxidizing the surface of the epitaxial layer, (c) etching a contact area through the silicon dioxide layer to the epitaxial layer surface, (d) cleaning the exposed epitaxial layer surface followed by lightly etching said surface, (e) evaporating chromium over all exposed surfaces, (f) etching away unwanted chromium and leaving a chromium film bonded to the exposed silicon surface and abutting silicon dioxide areas abutting the contact areas, and (g) attaching a lead element to said chromium film.

2. The method of claim 1 wherein said cleaning of the exposed epitaxial layer surface consists of the following steps: (a) cleaning with trichlorethylene, acetone and deionized water, (b) blowing dry with $N_2$, (c) etching with 10:1 hydrofluoric acid for 30 seconds at room temperature, (d) rinsing thoroughly with deionized water, (e) blowing dry with $N_2$.